United States Patent [19]

Brown

[11] Patent Number: 4,940,055
[45] Date of Patent: Jul. 10, 1990

[54] HIGH-RESOLUTION SPECTRAL SIGNATURE OF HUMAN ARTERIAL PLAQUE

[75] Inventor: Michael F. Brown, Charlottesville, Va.

[73] Assignee: University of Virginia Alumni Patents Foundation, Charlottesville, Va.

[21] Appl. No.: 106,669

[22] Filed: Nov. 3, 1987

[51] Int. Cl.$^5$ ............................................. A61B 5/055
[52] U.S. Cl. ............................................. 128/653 A
[58] Field of Search ................. 128/653, 654; 424/1.1, 424/9

[56] References Cited

U.S. PATENT DOCUMENTS 4,528,985  7/1985  Macovski.
4,543,959  10/1985  Sepponen.
4,577,636  3/1986  Spears ................................. 128/654

OTHER PUBLICATIONS

Cushley, F. et al., "$^{13}$C and $^{31}$P Nuclear Magnetic Resonance of Lipid Dispersions from Human Aorta", Can. J. Biochem. 58, 206–212, Canada, 1979.
Steim, J. et al., "Structure of Human Serum Lipoproteins", Science 162, 909–911, U.S.A., Nov., 1968.
Hamilton, J. et al., "Lipid Dynamics in Human Low-Density Lipoproteins and Human Aortic Tissue with Fibrous Plaques", J. Biol. Chem. 254, 5435–5441, U.S.A., 1979.
Leslie, R. B. et al., "Nuclear Magnetic Resonance Studies of Serum Low Density Lipoproteins (LDL$_2$)", Chem. Phys. Lipids 3, 152–158, Amsterdam, Holland, 1969.
Brown et al., "Membrane NMR: A Dynamic Research Area", J. Biochem. Biophys. Meth. 11, 71–81, U.S.A., 1985.
Finer, E. et al., "NMR Studies of Pig Low- and High--Density Serum Lipoproteins", Biochim. Biophys. Acta 176, 320–337, The Netherlands, 1975.
Sears, B., "Temperature–Dependent $^{13}$C Nuclear Magnetic Resonance Studies of Human Serum Low Density Lipoproteins", Biochemistry 15, 4151–4157, U.S.A., 1976.
Kroon, P. et al., "The Mobility and Cholesteryl Esters in Native and Reconstituted Low–Density Lipoprotein as Monitered by Nuclear Magnetic Resonance Spectroscopy", J. Biol. Chem. 253, 5340–5344, U.S.A., 1981.
Brown, M. et al., "Influence of Cholesterol on the Polar Region of Phosphatidylcholine and Phosphatidylethonolamine Bilayers", Biochemistry 17, 381–384, U.S.A., 1978.
Small, D., In Surface Chemistry of Biological Systems, 55–83, New York, 1970.
Wennerstrom, H. et al., "Biological and Model Membranes Studied by Nuclear Magnetic Resonance of Spin One Half Nuclei", Quart. Rev. Biophys. 10, 67–96, Great Britain, 1977.
Bloom, M. et al., "Fatty Acyl Chain Order in Lecithin Model Membranes Determined from Proton Magnetic Resonance", Biochemistry 17, 550–62, U.S.A., 1978.

(List continued on next page.)

Primary Examiner—C. Fred Rosenbaum
Attorney, Agent, or Firm—James Creighton Wray

[57] ABSTRACT

Noninvasive method of identifying and quantifying constituents of arterial plaque, comprising subjecting arterial walls to proton NMR spectroscopy or magnetic resonance imaging and looking for sharp spectral lines indicative of the accumulation of lipids within the walls of human arterial blood vessels, and detecting early changes to arterial walls due to atherogenesis. Also this method can be used to obtain information regarding chemical composition of atheroma in situ comprising subjecting an aortic wall to NMR spectroscopy or magnetic resonance imaging and observing spectral peaks indicative of accumulation of lipids within the aortic wall. Magnetic resonance imaging may also be used for this noninvasive method of diagnosing and monitoring atherosclerosis.

7 Claims, 3 Drawing Sheets

OTHER PUBLICATIONS

Chapman, D. et al., "High Resolution Nuclear Magnetic Resonance Spectra of Phospholipids and Related Substances", *J. Biol. Chem.* 241, 5044–5052, U.S.A. 1966.

Dybowski, C. et al., "NMR Relaxation in Cholesterol and Cholesteric Liquid Crystals", *J. Chem. Phys.* 55, 1576–1578, U.S.A., 1971.

Dixon, W., "Simple Proton Spectroscopic Imaging", *Radiology* 153, 189–194, U.S.A., 1984.

Frahm, J. et al., "Chemical Shift Selective MR Imaging Using a Whole Body Magnetic", *Radiology*, 156, 441–444, U.S.A., 1985.

Chapman, D. et al., "High-Resolution NMR Spectra of High-Density Serum Lipoproteins", *Biochim. Biophys. Acta* 176, 534–536, The Netherland, 1969.

Hamilton, J. et al., "Carbon–13 Nuclear Magnetic Resonance Studies of Cholesteryl Esters and Cholesteryl Ester/Triglyceride Mixtures", *J. Biol. Chem.* 252, 871–8780, U.S.A., 1977.

Matthews, R., "Spin–Lattice Relaxation in an Homoanalogous Series of $C_{18}$ Esters of Cholesterol", *J. Magn. Reson.*, 166–172, U.S.A., 1975.

HIGH-RESOLUTION SPECTRAL SIGNATURE OF HUMAN ARTERIAL PLAQUE

BACKGROUND OF THE INVENTION

1. Field of the Invention

This invention relates generally to a non-invasive method of identifying and quantifying constituents of arterial plaque, and specifically to a method using protons NMR spectroscopy to indicate accumulation of lipids within the walls of human arterial blood vessels and within the aortic walls.

2. Prior Art

Atherosclerosis is the leading cause of death and debility in the United States and other Western industrialized nations. Its presence is often first identified by the occurrence of heart attack, stroke, renal failure, or sudden death. Nearly one of every three Americans can expect to suffer from the consequences of this disease. In particular, coronary artery disease due to atherosclerosis takes the lives of approximately 550,000 Americans each year—an enormous toll. Put in economic terms, the cost to the United States alone has been estimated to exceed 60 billion dollars annually.

The early lesions in blood vessel walls are marked by clinically silent accumulations of cholesterol and cholesteryl esters, as well as triglycerides, phospholipids, and various lipoproteins. The lipids deposited between the intima and media of the arterial wall are believed to originate mainly from serum low density lipoproteins (LDL), which transport cholesterol within the body in the form of cholesteryl esters. Epidemiological studies, drug trials, and biochemical studies have all pointed to the implication of cholesterol and saturated fats of dietary and endogenous origin in the etiology of atherosclerosis. Dietary polyunsaturated fats, by contrast, are associated with reduced LDL cholesterol levels and lower incidence of cardiovascular disease. Lipids accumulating within the arterial wall may initiate the atherosclerotic process through injury of the blood vessel inner surface, followed by release of chemotactic substances, attraction of monocytes which ingest further lipids to become foam cells, and agglutination of platelets. Production of growth factors can then stimulate smooth muscle cells to migrate to the damaged area, which differentiate into fibroblasts leading to eventual calcification. The clinical end results of atherosclerosis are caused by thrombosis or occlusion of the diseased vessels due to arterial plaque, thereby reducing or eliminating the supply of blood to key tissues and organs, such as the heart or brain.

Beyond this, little is known with certainty of the means by which lipids accumulate within the arterial wall, a process beginning often in childhood or early adolescence. As a result, strategies for prevention of atherosclerosis within the population at large have met with limited success. The availability of noninvasive methods for monitoring of atherogenesis in conjunction with more effective regimens for treatment of susceptible individuals would represent a significant step forward. In particular, it seems worthwhile to pursue development of methods for accurately identifying and quantifying the lipid constituents of atherosclerotic plaque within human arterial vessels, which mark early and potentially reversible disease stages. Previous investigators have shown that high-resolution, carbon-13 ($^{13}C$) NMR spectra can be acquired from in tact (ex vivo) atherosclerotic lesions of human and animal origin, Hamilton et al., "Lipid Dynamics in Human Low-Density Lipoproteins and Human Aortic Tissue with Fibrous Plaques", J. BIOL. CHEM. 254, 5435–5441 (U.S.A. 1979); Cushley et al., "A $^{13}C$ and $^{31}P$ Nuclear Magnetic Resonance of Lipid Dispersions from Human Aorta", CAN. J. BIOCHEM. 58, 206–212 (Canada 1979). Others have obtained high-resolution $^{13}C$ and proton ($^1H$) NMR spectra from serum lipoproteins, Steim et al., "Structure of Human Serum Lipoproteins", SCIENCE 162, 909–911 (U.S.A. 1968); Leslie et al., "Nuclear Magnetic Resonance Studies of Serum Low Density Lipoproteins (LDL2)", CHEM. PHYS. LIPIDS 3, 152–158 (Holland 1969); Finer et al., "NMR Studies of Pig- Low and High- Density Serum Lipoproteins", BIOCHIM. BIOPHYS. ACTA 176, 320–337 (Holland 1975); Sears, "Temperature-Dependent 13C Nuclear Magnetic Resonance Studies of Human Serum Low Density Lipoproteins", BIOCHEMISTRY 15, 4151–4157 (U.S.A. 1976); Hamilton et al., "Lipid Dynamics in Human Low-Density Lipoproteins and Human Aortic Tissue with Fibrous Plaques", J. BIOL. CHEM. 254, 5435–5441 (U.S.A. 1979). However, proton NMR studies of arterial tissue have not been reported.

SUMMARY OF THE INVENTION

It has been discovered that well-resolved proton ($^1H$) nuclear magnetic resonance (NMR) spectra can be obtained from human atherosclerotic plaque. The fraction of the total spectral intensity corresponding to the sharp $^1H$ NMR signals is temperature dependent, and approaches unity at body temperature (37C.). Studies of lipids found in human atheroma have been conducted to identify the chemical and physical origin of the spectral signature. The samples were characterized through assignment of their $^1H$ NMR chemical shifts and by measurement of their $T_1$ and $T_2$ relaxation times as a function of magnetic field strength. The studies indicate that the relatively sharp $^1H$ NMR signals from human atheroma (excluding water) are due to a mixture of cholesteryl esters, whose liquid-crystalline to isotropic fluid phase transition is near body temperature. These findings offer a basis for noninvasive imaging by NMR to monitor fatty plaque formation within the wall of the aorta and other arterial vessels.

Other advantages and features of the invention will be apparent from the disclosure, which includes the above and ongoing specification with the claims and the drawings.

BRIEF DESCRIPTION OF THE DRAWINGS

FIG. 1A shows an expansion of the chemical shift range from −0.5 to +6.5 ppm relative to DSS, and FIG. 1B shows the full spectrum width from −70 to +70 kHz in frequency units.

FIG. 2A shows an $^1H$ NMR spectrum of a sample of lyophilized (freeze-dried) atheroma in deuterated buffer different from that of FIGS. 1A and 1B, together with peak assignments; FIG. 2B depicts an $^1H$ NMR spectrum of the corresponding total extracted lipids containing deuterated buffer; FIG. 2C shows an $^1H$ NMR spectrum of a control sample of excised, non-atheromatous aortic wall in deuterated buffer, excluding adventitial fat.

DETAILED DESCRIPTION OF THE INVENTION

Nuclear magnetic resonance (NMR) spectroscopy can provide useful information regarding the structural and dynamic properties of the lipid constituents of biological tissues. Cholesteryl esters, the major class of lipids in atheromatous tissue, are liquid-crystalline materials; they are capable of undergoing transitions among distinct intermediate phases between the liquid and solid states. The existence of well-resolved $^1$H NMR signals from human atheroma (fatty plaque) is not obvious priori, since as a rule solid-like materials give rise to broad, low resolution spectra, Wennerstrom et al., "Biological and Model Membranes Studied by Nuclear Magnetic Resonance of Spin One Half Nuclei", QUART. REV. BIOPHYS. 10, 67-96 (Great Britain 1977). It was reasoned that the presence of cholesteryl esters in fatty plaque, with relatively low isotropic to liquid-crystalline phase transition temperatures, could give rise to sharp $^1$H NMR spectra as seen for other isotropic fluids. Thus the objective was to determine whether NMR could be used to detect accumulations of cholesteryl esters and other lipids which form atheroma within the walls of human arterial blood vessels.

Figure 1:
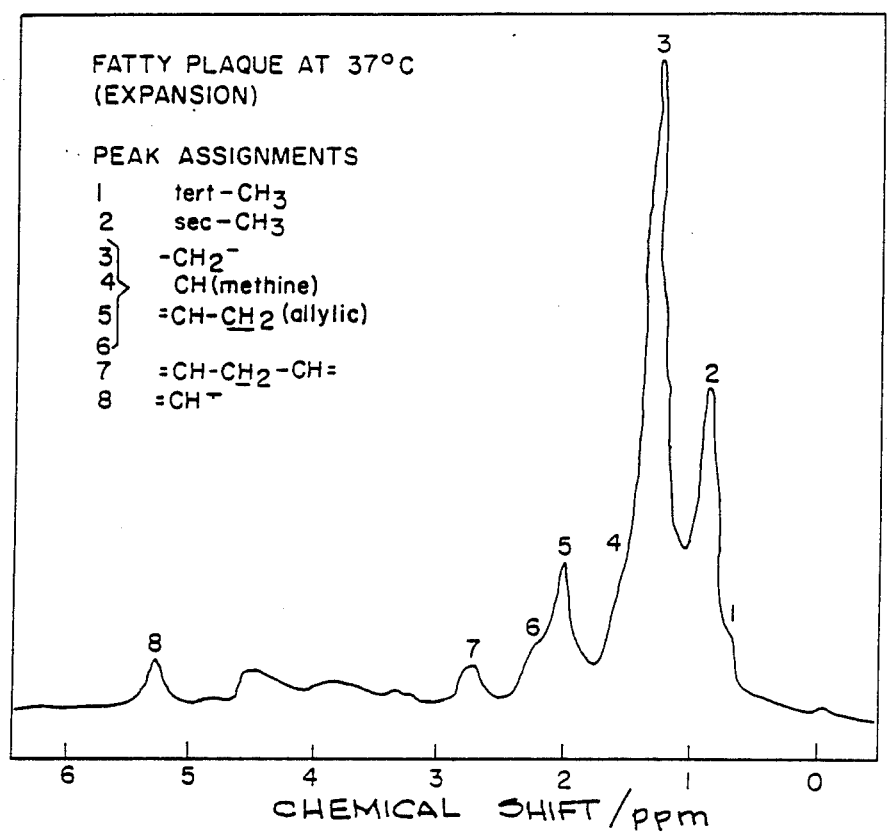
FIGS. 1A and 1B graphically illustrate the representative $^1H$ NMR spectra, obtained at a body temperature of 37.C from a sample of freshly excised human atheroma (fatty plaque). Specifically.
Figure 1A:
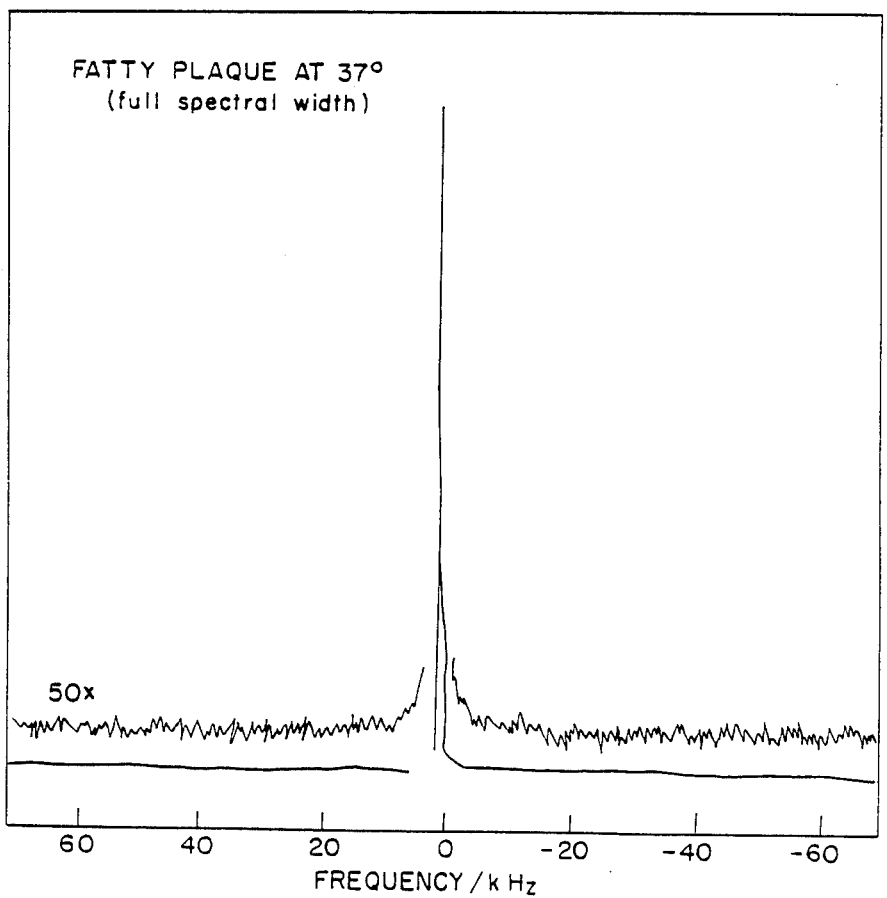

Freshly excised human aortic tissue specimens were studies with and without atheroma. Representative $^1$H NMR spectra, obtained at body temperature (37C.) from a sample of freshly excised human atheroma (fatty plaque), are shown in FIGS. 1A and 1B. The sharply resolved spectral lines are identified in FIG. 1A. Most of the observed intensity is contained in the narrow, well-resolved resonances, as evidenced by FIG. 1B, which shows the $^1$H NMR spectrum of the same sample plotted over a larger range ($-70$ to $+70$ kHz), together with vertical expansions of the regions to either side of the sharp peaks. The vinyl, double allylic, and allylic resonances are due largely to the unsaturated and polyunsaturated fatty acyl chains of the atheromatous lipid molecules, which include cholesteryl esters, triglycerides, and phospholipids, whereas the methylene and secondary methyl proton resonances also include contributions from lipids with saturated acyl chains. The sterol moieties of the atheromatous cholesteryl esters contribute to the methylene peak, and give rise to methine and tertiary methyl proton resonances. Thus, information is obtained regarding the chemical compositions of atheroma in situ, that is, intact within the aortic wall.

FIGS. 1A and 1B graphically illustrate high-resolution $^1$H NMR spectra of human atheroma (fatty plaque) obtained at 37.C (body temperature). The spectra were acquired at a magnetic field strength of 8.481 tesla (resonance frequency of 361.1 MHz). The sample was suspended in deuterated buffer and the residual water proton peak at 4.63 ppm was suppressed selectively by radiofrequency irradiation. An expansion of the chemical shift range from $-0.5$ to $+6.5$ ppm relative to DSS is shown in FIG. 1A, and the full spectral width from $-70$ to $+70$ kHz in frequency units is shown in FIG. 1B. In FIG. 1A, the observed spectral lines are assigned, from right to left, to the protons of the tertiary methyl (tert-CH$_3$) (peak 1); secondary methyl (sec-CH$_3$) (peak 2); methylene (CH$_2$), methine (CH), and allylic (=CH—CH$_2$) (peaks 3-6); double allylic (=CH—CH$_2$—CH=) (peak 7); and vinyl (=CH—) (peak 8) groups of the lipid constituents of the arterial plaque. In FIG. 1B, the $^1$H NMR spectrum of the same sample is shown over a larger frequency range, together with 50-fold vertical expansions to either side of the sharp resonances; note the flat baseline and the absence of an underlying broad signal. Such high-resolution $^1$H NMR spectra are typical of fluids, whereas human fatty plaque is macroscopically solid in appearance.

Figure 2A:
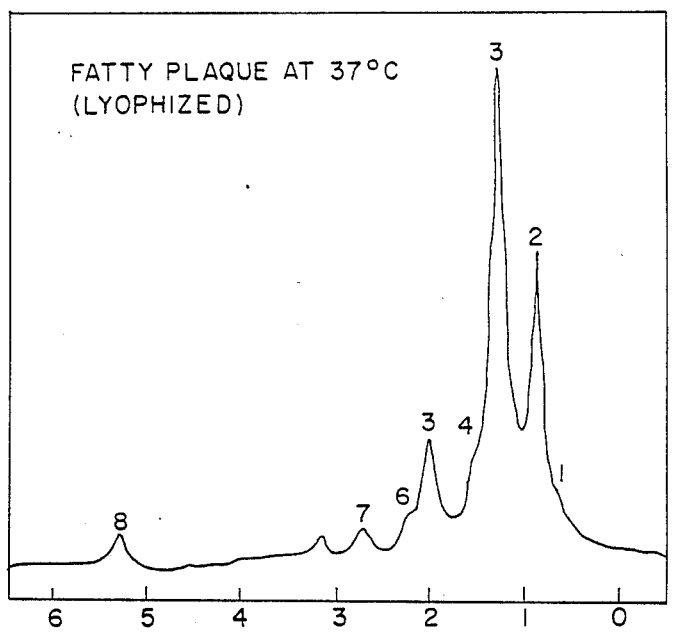
FIGS. 2A–C graphically represent $^1H$ NMR spectra of arterial wall constituents obtained at 37C. Specifically.
Figure 2B:
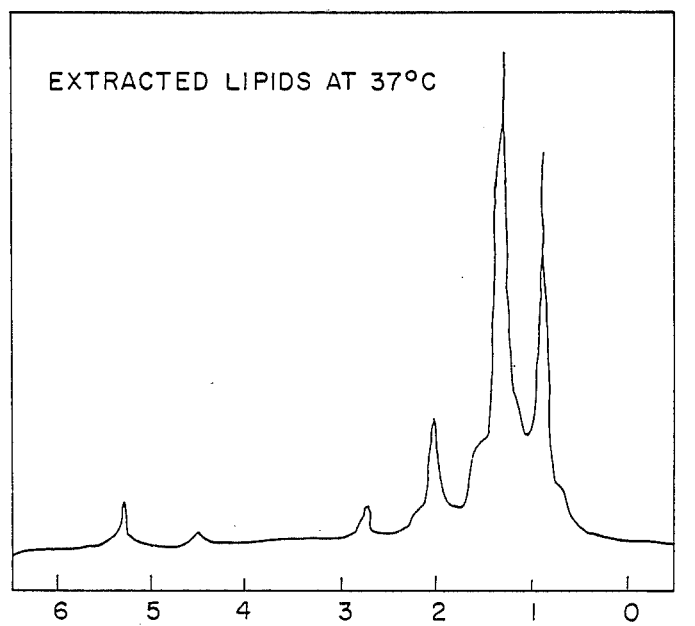

In addition to excised human atheroma, samples of lyophilized (freeze-dried) atheroma, its extracted lipids, and control samples of normal arterial wall were studies (FIGS. 2A and 2B). By lyophilization, one can further reduce the magnitude of the large water proton signal, thereby more clearly revealing resonances from the lipid constituents of arterial plaque. Similar $^1$H NMR spectra were obtained from lyophilized fatty plaque (FIG. 2A) and total extracts of its lipids (FIG. 2B) as from atheroma in situ. $^1$H NMR studies of control samples of normal intima-medial aortic wall (FIG. 2C) did not yield well-resolved spectral lines. Thus, the sharp resonances of human atheroma (fatty plaque) at 37C. are most likely due to accumulated lipids within the arterial wall. On a molar basis, the spectra mainly reflect the presence of cholesteryl esters, with minor contributions from triglycerides and phospholipids.

Figure 2C:
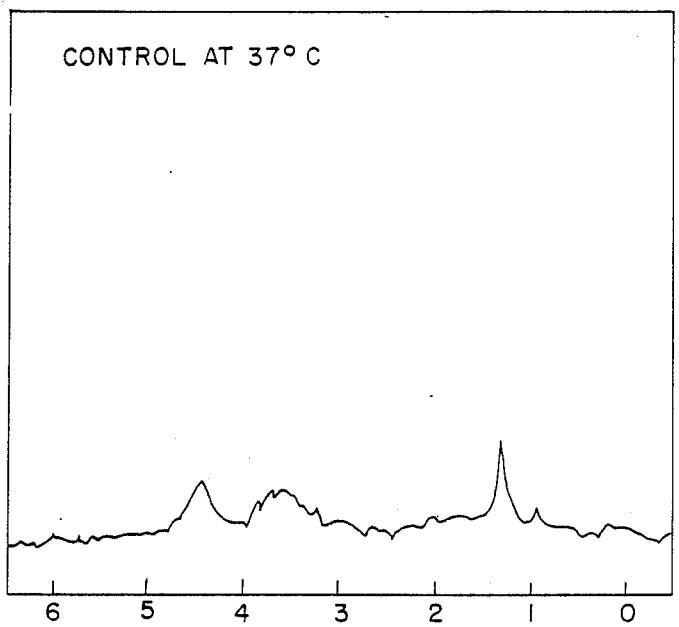

FIGS. 2A-C graphically represent the $^1$H NMR spectra of arterial wall constituents obtained at 37C. Expansions of the $-0.5$ to $+6.5$ ppm spectral region containing the sharp resonances are shown; little or no underlying broad components were observed in the same spectra plotted over a larger frequency range. FIG. 2A shows an $^1$H NMR spectrum of a sample of lyophilized (freeze-dried) atheroma in deuterated buffer different from that of FIGS. 1A and 1B, together with peak assignments. FIG. 2B depicts an $^1$H NMR spectrum of the corresponding total extracted lipids containing deuterated buffer. Finally, FIG. 2C shows an $^1$H NMR spectrum of a control sample of excised, non-atheromatous aortic wall in deuterated buffer, excluding adventitial fat, which was deemed not to contain significant atheroma by visual inspection; here the lipid resonances are much smaller. The high-resolution $^1$H NMR spectra of atheroma thus appear to arise largely from the lipid constituents of fatty plaque.

To further characterize the atheromatous lipids, their spin-spin and spin-lattice relaxation times were determined by $^1$H NMR spectroscopy at different magnetic field strengths. The sharp spectral lines observed for excised atheroma and its hydrated extracted lipids (FIGS. 1A, 1B and 2A-C) were found to have approximately Lorentzian lineshapes at 37C. and higher temperatures, to within experimental error, as expected of an isotropic fluid (not shown). The spin-spin ($T_2$) relaxation times obtained at 37C. by fitting the individually resolved lines to Lorentzian spectral lineshapes are summarized in Table 1. In addition, data is included for anhydrous cholesteryl linoleate in the isotropic phase, a representative cholesteryl ester found in human fatty plaque (see below). Within experimental error, little difference is seen in the linewidths and $T_2$ values of the different samples, consistent with $^{13}$C NMR studies. Over the range of magnetic field strengths from 6.342 to 11.75 tesla ($^1$H frequencies of 270.0 to 500.1 MHz), the estimated linewidths and $T_2$ values of the corresponding resonances are similar, suggesting that the linebroadening is largely homogeneous in origin and due to molecular motions. The values of the spin-lattice ($T_1$) relaxation times are also indicated in Table 1 for human atheroma, its extracted lipids, and cholesteryl linoleate at 37C. For each of the samples investigated, the $T_1$ relaxation times of the resolved resonances increase significantly with increasing magnetic field strength, that is, resonance frequency (Table 1), consistent with earlier $^1$H NMR studies of cholesteryl esters. The $T_1$ values of the corresponding resonances of human fatty plaque and its extracted lipids are similar to those of cholesteryl linoleate in the isotropic phase and to those of phospholipid bilayers, but differ from that of water in biological tissues.

Table 1. Proton spin-spin ($T_2$) and spin-lattice ($T_1$) relaxation times of lipids of human atheroma at different magnetic field strengths (temperature=37C.)*.

Figure 3:
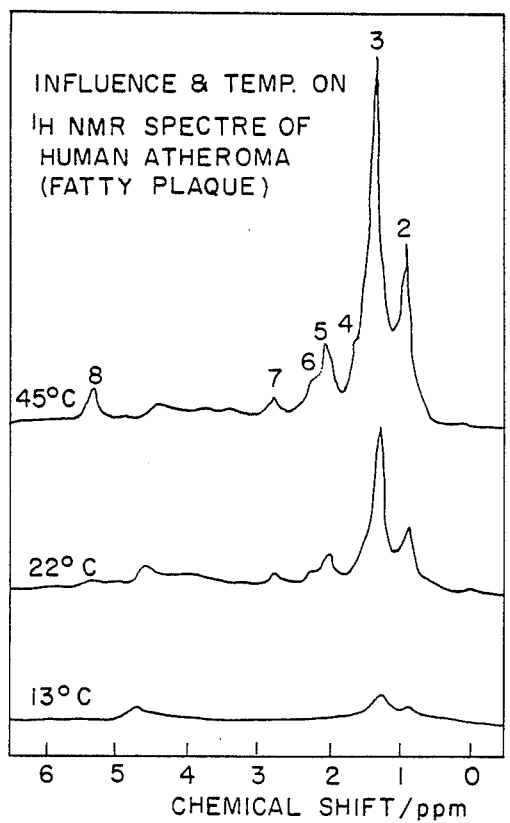
FIG. 3 graphically illustrates temperature dependence of $^1$H NMR spectra of human atheroma (fatty plaque).

* $T_2$ values were estimated from fits of resolved sharp resonances to Lorentzian lineshapes using the relation $\Delta\nu=(\pi T_2)^{-1}$, where dv is the full-width at half-height. The estimated errors of the $T_2$ values are ±20%. $T_1$ relaxation times and errors were determined from three-parameter exponential fits of peak amplitudes of partially relaxed spectra obtained using the inversion-recovery pulse sequence.
* Resonance assignments are given (FIGS. 1A and 1B).
* Chemical shifts (δ) are in parts per million (ppm) relative to an external capillary containing DSS.
* Magnetic field strength in tesla. One tesla (T) is equal to $10^7$ gauss (g).

signal corresponding to the sharp IH NMR spectral components decreases, indicative of a thermotropic transition of the lipid constituents near body temperature (37.C). Similar results are found for extracts of the total atheromatous lipids (not shown). The intensities of the well-resolved peaks are temperature dependent and are maximal at about 37.C and higher temperatures, suggesting that most or all of the total signal is observed. Below body temperature, a reversible decrease in the peak amplitudes is seen, indicating a transition to a broader spectrum whose breadth exceeds the range depicted. At sufficiently low temperatures, essentially no high-resolution $^1$H NMR spectrum is found (FIG. 3). Since broad IH NMR spectra are characteristic of solids and liquid crystals, the results of FIG. 3 suggest that the atheromatous cholesteryl esters undergo an isotropic to liquid-crystalline phase transition below body temperature. This conclusion is in agreement with x-ray diffraction and polarized light microscopy studies, which suggest that cholesteryl esters can exist within the intima and media of the arterial wall as small droplets due to their low solubility in other arterial tissue constituents. The results of $^1$H NMR spectroscopy show clearly that the cholesteryl ester molecules of atheromatous lesions exist mainly in the isotropic liquid phase at body temperature, or near the onset temperature of their transition to the liquid-crystalline state.

The $^1$H NMR lineshapes of biologically important cholesteryl esters in different physical states were then investigated, including their liquid-crystalline meso-

TABLE 1

Proton spin-spin ($T_2$) and spin-lattice ($T_1$) relaxation times of lipids of human atheroma at different magnetic field strengths (temperature = 37° C.)*

| sample | reso-nance* | d/ppm* | $T_2$/ms | | | $T_1$/s | | |
|---|---|---|---|---|---|---|---|---|
| | | | 6.34T* | 8.48T | 11.7T | 6.34T | 8.48T | 11.7T |
| fatty plaque | 2 | 0.87 | 6 | 6 | 6 | 0.45 ±0.01 | 0.60 ±0.01 | 0.75 ±0.04 |
| | 3 | 1.27 | 7 | 5 | 6 | 0.44 ±0.01 | 0.57 ±0.02 | 0.74 ±0.07 |
| | 5 | 1.99 | 7 | 6 | 6 | 0.39 ±0.01 | 0.56 ±0.03 | 0.72 ±0.03 |
| | 7 | 2.73 | 8 | 6 | 8 | — | 0.58 ±0.04 | — |
| | 8 | 5.28 | 7 | 6 | 6 | 0.59 ±0.03 | 0.70 ±0.04 | 0.78 ±0.06 |
| extracted lipids | 2 | 0.86 | 11 | 7 | 9 | 0.30 ±0.02 | 0.45 ±0.01 | 0.64 ±0.01 |
| | 3 | 1.28 | 8 | 7 | 6 | 0.28 ±0.02 | 0.42 ±0.01 | 0.57 ±0.02 |
| | 5 | 2.01 | 9 | 7 | 6 | 0.23 ±0.02 | 0.38 ±0.01 | 0.55 ±0.02 |
| | 7 | 2.74 | 11 | 7 | 5 | — | 0.37 ±0.03 | — |
| | 8 | 5.30 | 12 | 7 | 7 | 0.24 ±0.08 | 0.48 ±0.05 | 0.63 ±0.04 |
| cholesteryl linoleate | 2 | 0.88 | — | 10 | — | 0.53 ±0.01 | 0.72 ±0.02 | — |
| | 3 | 1.30 | — | 6 | — | 0.52 ±0.01 | 0.69 ±0.01 | |
| | 5 | 2.11 | — | 8 | — | 0.48 ±0.01 | 0.62 ±0.01 | — |
| | 7 | 2.78 | — | 13 | — | 0.41 ±0.03 | 0.58 ±0.01 | — |
| | 8 | 5.38 | — | 9 | — | 0.60 ±0.02 | 0.84 ±0.05 | — |

FIG. 3 graphically illustrates the temperature dependence of $^1$H NMR spectra of human atheroma (fatty plaque). Representative expansions of the −0.5 to +6.5 ppm chemical shift range containing the observed resonances are shown plotted at the same vertical scale. With decreasing temperature, the fraction of the total phases, to further identify the chemical and physical basis for the observed spectral signature of human atheroma. The results substantiate that the sharp $^1$H NMR spectra of human atheroma reflect largely the presence of cholesteryl esters which exist in the isotropic liquid phase at body temperature (37C.). Moreover, this shows that the thermotropic behavior of samples of arterial plaque as detected by $^1$H NMR spectroscopy depends on the content of cholesteryl esters and triglycerides, and thus can provide information on the chemical and physical properties of the atheromatous lipid molecules. Free cholesterol, on the other hand, is only sparingly soluble in cholesteryl esters; it is often found in the solid or crystalline phase in atheromatous tissue and presumably gives rise to broad, undetected $^1$H NMR signals.

In NMR imaging one applies magnetic field gradients to encode the spatial locations of protons in biological specimens—largely due to water and lipids—in the frequency and phase of their NMR signals. The contrast between different tissues in NMR images is a function of at least three parameters for each of the individual chemically shifted resonances; namely p, the proton density, $T_1$, the spin-lattice or longitudinal relaxation time, and $T_2$, the spin-spin or transverse relaxation time. In addition, macroscopic transport such as flow can also influence contrast. A difference in one or more of these parameters can distinguish neighboring tissues in NMR imaging. For example, the $T_1$ values of water in cancerous tissue are found to differ significantly from that of normal tissues and form the basis for use of NMR imaging in cancer detection and diagnosis. Likewise the present findings offer a necessary and sufficient basis for use of $^1$H NMR to evaluate the accumulation of lipids which occurs in atherosclerosis, since different spectral lineshapes and $T_2$ values are observed relative to normal arterial wall. The $T_1$ values of the atheromatous lipids (Table 1) differ significantly from that of tissue water and may also contribute to contrast enhancement. Preliminary NMR imaging studies of human atheromatous tissue have been reported, Wesbey et al., "Magnetic Resonance Applications in Atherosclerotic Vascular Disease", CARDIOVASC. INTERVEN. RADIOL. 8, 342-350, (U.S.A. 1986).

As described above, the results of $^1$H NMR spectroscopy suggest that NMR images of human atheroma (fatty plaque) obtained at body temperature will reflect the presence of cholesteryl esters in the isotropic phase, with well-resolved spectral lines. Such narrow spectral lines represent slowly decaying signals in the time-domain (i.e. with relatively long $T_2$ values), while broad lines correspond to rapidly decaying signals (i.e. with very short apparent $T_2$ values). It is important to note that $T_2$ is the time constant for the monoexponential decay of NMR signal intensity in the time-domain, which by Fourier transformation corresponds to a Lorentzian lineshape as typically observed for liquid samples. On the other hand, $T_2$ is ill-defined for broad, non-Lorentzian lineshapes, as are characteristic of the solid and liquid-crystalline phases. The $T_2$ values estimated from the linewidths of the sharp $^1$H NMR spectral components due to atheromatous lipids are about 5-10 ms (Table 1), suggesting that significant intensity will remain with the relatively long echo times typically employed for NMR imaging, Dixon, "Simple Proton Spectroscopic Imaging", RADIOLOGY 13, 189-194 (U.S.A. 1984). The presence of atheromatous lipids can be identified by an increase in signal strength relative to normal arterial wall, thereby providing a basis for quantification of the size of the atheromatous regions. Use of shorter TE values will enable further chemical and physical information to be obtained, as well as quantification of the extent of deposition of cholesteryl esters and other lipids. To make use of the high-resolution $^1$H NMR spectral signature of atheroma, NMR imaging methods for separating the fat and water signals can be applied. A number of schemes for chemical shift imaging have been described. With such methods and knowledge of the spectral lineshapes as described here, one can achieve eventual quantification of the size of early atheromatous lesions and the extent of deposition of cholesteryl esters and other lipids in living human subjects.

The results described here can be expected to find application in the detection and monitoring of arterial disease in living human individuals. Current methods utilizing angiography for these purposes are invasive, are of possible detriment to other aspects of human health, and are ill-suited and impractical for serial monitoring of individuals or human populations. As a result, prevalent strategies for therapeutic intervention have tended to rely on reduction or elimination of risk factors shown from epidemiological studies and clinical trials to be correlated significantly with cardiovascular disease due to atherosclerosis. Together with risk factor reduction, for example through behavioral, diet or drug therapy, the results described here offer the potential for preventive treatment of early arterial disease in otherwise asymptomatic patients. It has been demonstrated that information regarding the chemical and physical state of the lipids of human arterial plaque can be obtained in situ through use of $^1$H NMR spectroscopy. This knowledge provides a necessary and sufficient basis for the development of tests for diagnosis of early atheromatous lesions within the walls of the human aorta and other blood vessels. In conjunction with NMR imaging, the present results can be used to detect and quantify potentially reversible atheromatous disease, so that tissue responses can be monitored on an individual basis and therapy adjusted until benefit is realized. In this manner one can follow the progression of arterial plaque lipid deposition, and thus hopefully reduce the leading cause of death in the United States and other industrial nations.

References and Footnotes

1. R. I. Levy, *Arteriosclerosis* 1, 312 (1981).
2. D. M. Small and G. G. Shipley, *Science* 185, 222 (1974).
3. R. Ross and J. A. Glomset, *New Eng. J. Med.* 295, 369 (1976); R. Ross and J. A. Glomset, *ibid.* 295, 420 (1976); R Ross, *ibid.* 314, 488 (1986).
4. M. S. Brown and J. L. Goldstein, *Sci. Am.* 251, 58 (1984); M. S. Brown and J. L. Goldstein, *Science* 232, 34 (1986).
5. W. B. Kannel, W. P. Castelli, T. Gordon, P. M. McNamara, *Ann. Int. Med.* 74, 1 (1971).
6. Lipid Research Clinics Program, *J. Am. Med. Assoc.* 251, 351 (1984); Research Clinics Program, *ibid.* 251, 365 (1984).
7. T. J. Peters and C. De Duve, *Exp. Mol. Pathol.* 20, 228 (1974).
8. A. R. Tall, D. Atkinson, D. M. Small, R. W. Mahley, *J. Biol. Chem.* 25 (1977).
9. D. J. Gordon, K. M. Salz, K. J. Roggenkamp, F. A. Franklin, Jr., *Arteriosclerosis* 2, 537 (1982); W. S. Harris, W. E. Conner, M. P. McMurry, *Metabolism* 32, 179 (1983).
10. J. A. Glomset, *New Eng. J. Med.* 312, 1253 (1985); D. Kromhout, E. B. Bosschieter, C. de Lezenne Coulander, *ibid.* 312, 1205 (1985); B. E. Phillipson, D. W. Rothrock, W. E. Conner, W. S. Harris, D. R. Illingworth, *ibid.* 312, 1210 (1985); T. H. Lee et al., *ibid.* 312, 1217 (1985).
11. S. S. Katz, G. G. Shipley, D. M. Small, *J. Clin. Invest.* 58, 200 (19
12. E. B. Smith, *J. Atheroscler. Res.* 5, 224 (1965); E. B. Smith and R. S. Slater, *Atherosclerosis* 15, 37 (1972); B. Lundberg, *ibid.* 56, 93 (1985).
13. R. G. M. Duffield et al, *Lancet ii*, 639 (1983).
14. J. A. Hamilton, E. H. Cordes, C. J. Glueck, *J. Biol. Chem.* 254, 5435 R. J. Cushley, B. J. Forrest, A. K. Grover, S. R. Wassall, *Can. J. Biochem.* 58, 206 (1980); P. A. Kroon, D. M. Quinn, E. H. Cordes, *Biochemistry* 21, 2745 (1982).
15. J. M. Steim, 0. J. Edner, F. G. Bargott, *Science* 162, 909 (1968); R. B. Leslie, D. Chapman, A. M. Scanu, *Chem. Phys. Lipids* 3, 152 (1969); D. Chapman, R. B. Leslie, R. Hirz, A. M. Scanu, *Biochim. Biophys. Acta* 176, 524 (1969); E. G. Finer, R. Henry, R. B. Leslie, R. N. Robertson, *ibid.* 380, 320 (1975); B. Sears, R. J. Deckelbaum, M. J. Janiak, G. G. Shipley, D. M. Small *Biochemistry* 15, 4151 (1976); J. A. Hamilton and E. H. Cordes, *J. Biol. Chem.* 253, 5193 (1978); P. A. Kroon, *ibid.* 256, 5332 (1981); P. A. Kroon and M. Krieger, *ibid.* 256, 5340 (1981); P. A Kroon and J. Seidenberg, *Biochemistry* 21, 6483 (1982).
16. D. G. Gadian, *Nuclear Magnetic Resonance and Its Applications to Living Systems* (Clarendon Press, Oxford, 1982); P. G. Morris, *Nuclear Magnetic Resonance Imaging in Medicine and Biology* (Clarendon Press, Oxford, 1986).
17. M. F. Brown and J. Seelig, *Biochemistry* 17, 381 (1978): M. F. Brown and G. D. Williams, *J. Biochem. Biophys. Meth.* 11, 71 (1985).
18. D. M. Small, in *Surface Chemistry of Biological Systems*, M. Blank, (Plenum Press, New York, 1970), pp. 55–83.
19. Although heterogeneous in composition and morphology, most arterial lesions can be classified in order of severity as fatty streaks, fatty plaque or intermediate lesions, fibrous plaque, gruel plaque, and so-called complex lesions (2,3,11,12). The severity of the lesions parallels the progression of lipid deposition within the arterial wall (2,11). Fatty streaks contain a phospholipid liquid-crystalline phase saturated with cholesterol and cholesteryl esters, coexisting with a second, oily or liquid-crystalline phase of cholesteryl ester droplets. Fatty plaque and fibrous plaque are comprised of the two preceding phases, together with a third phase of free cholesterol monohydrate crystals. In more advanced lesions, the lipids in the above three phases are associated with scar formation, calcification, and thrombosis (blood clot).
20. H. Wennerstrom and G. Lindblom, *Quart. Rev. Biophys.* 10, 67 (1977); Bloom et al., *Biochemistry* 17, 5750 (1978).
21. D. M. Engelman and G. M. Hillman, *J. Clin. Invest.* 58, 997 (1976); G. M. Hillman and D. M. Engelman, *J. Clin. Invest.* 58, 1008 (1976).
22. J. D. Pearlman, J. Zajicek, M. B. Merikel, C. S. Carman, C. R. Ayers J. R. Brookeman, M. F. Brown, *Science*, submitted.
23. D. Chapman and A. Morrison, *J. Biol. Chem.* 241, 5044 (1966); N. S. Bhacca and D. H. Williams, *Applications of NMR Spectroscopy in Organic Chemistry Illustrations from the Steroid Field* (Holden-Day, San Francisco, 1964).
24. C. R. Dybowski and C. G. Wade, *J. Chem. Phys.* 55, 1576 (1971); R. M. C. Matthews and C. G. Wade, *J. Magn. Reson.* 19, 166 (1975).
25. P. A. Kroon, M. Kainosho, S. I. Chan, *Biochim. Biophys. Acta* 433, 28 (1976); M. F. Brown, G. P. Miljanich, E. A. Dratz, *Biochemistry* 16, 2640 (1977); M. F. Brown, *J. Chem. Phys.* 77, 1576 (1982); M. F. Brown, A. A. Riberio, G. D. Williams, *Proc. Natl. Acad. Sci. USA* 80, 4325 (1983); M. F. Brown, *J. Chem. Phys.* 80, 2808 (1984); M. F. Brown, ibid. 80, 2832 (1984); M. F. Brown, J. F. Ellena, C. Trindle, G. D. Williams, ibid. 84, 465 (1986).
26. J. A. Hamilton, N. Oppenheimer, E. H. Cordes, *J. Biol. Chem.* 252, 80 (1977).
27. R. J. Deckelbaum, G. G. Shipley, D. M. Small, *J. Biol. Chem.* 252, 74
28. R. Damadian, *Science* 171, 1151 (1971).
29. L. Kaufman, L. E. Crooks, P. E. Sheldon, W. Rowan, T. Miller, *Invest Radiol.* 17, 554 (1982); R. J. Herfkens et al., *Radiology* 147, 749 (1983); R. J. Herfkens et al., ibid. 148, 161 (1983); K. Soila, P. Nummi, T. Ekfors, M. Viamonte, M. Kormano, *Invest. Radiol.* 21, 411 (1986); G. E. Wesbey, C. B. Higgins, J. D Hale, P. E. valk, *Cardiovasc. Intervent, Radiol* 8, 342 (1986).
30. In NMR imaging, the time between the excitation pulse and the spin-e maximum is denoted as TE and the repetition time between serial excitation pulses is referred to as TR (16,34). Proton density or "p-weighted" NMR images are obtained using relatively short values of TE (<20 ms) and long values of TR (>2 s) for maximum signal intensity. "$T_1$-weighted" NMR images are obtained using relatively short values of TR (0.5 to 1 s). For "$T_2$-weighted" images, longer values of TE are selected (50 to 90 ms) with long TR times to allow equilibration between subsequent scans. It should be noted that due to the time necessary for spatial encoding, the TE values are such that the NMR images are always strongly biased—that is $T_2$-weighted—in favor of signals whose transverse magnetization decays relatively slowly, corresponding to sharp spectral lines in the frequency-domain. Thus, rapidly decaying signals in the time-domain (corresponding to broad spectral lines) do not contribute to the images.
31. W. T. Dixon, *Radiology* 153, 189 (1984); J. Frahm et al., *Radiology* 156, 441 (1985); D. Kunz, *Magn. Reson. Med.* 3, 639 (1986).

I claim:
1. The noninvasive method of identifying and quantifying constituents of arterial plaque comprising subjecting arterial walls to localized proton NMR spectroscopy, obtaining a proton NMR spectra and evaluating the proton NMR spectra exclusive of water for sharp spectral lines indicative accumulation of lipids in walls of human arterial blood vessels and detecting early changes to arterial walls due to atherogenesis.
2. The method of claim 1 wherein the looking for sharp spectral lines comprises the evaluating the spectra for methylene, vinyl, methine and allylic peaks.
3. The method of claim 1 wherein the evaluating comprises evaluating the spectra for methylene peaks.
4. The method of obtaining information regarding chemical composition of atheroma in situ comprising subjecting an aortic wall to localized proton NMR spectroscopy, obtaining a proton NMR spectra and evaluating the proton NMR spectra exclusive of water for spectral peaks indicative of accumulation of lipids in the aortic wall.

5. The method of claim 4 wherein the evaluating comprises evaluating the spectra for tertiary methyl, secondary methyl, methylene, vinyl methine and allylic peaks.

6. The noninvasive method of diagnosing and monitoring atherosclerosis, comprising the steps of subjecting arterial walls to a nuclei yielding spectral lines apparatus, obtaining a spectra exclusive of water and evaluating the spectra for sharp spectral lines indicative of accumulation of lipids in walls of human arterial blood vessels and detecting early changes to arterial walls due to atherogenesis.

7. The method of claim 6, wherein the nuclei yielding spectral lines apparatus is a magnetic resonance imaging apparatus which spatially encodes the NMR signals due to atheromatous lipids.

* * * * *